US008614428B2

(12) United States Patent
Horiuchi et al.

(10) Patent No.: US 8,614,428 B2
(45) Date of Patent: Dec. 24, 2013

(54) CHARGED PARTICLE BEAM WRITING METHOD AND CHARGED PARTICLE BEAM WRITING APPARATUS

(75) Inventors: Tomoyuki Horiuchi, Shizuoka (JP); Atsushi Hayamizu, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 687 days.

(21) Appl. No.: 12/704,920

(22) Filed: Feb. 12, 2010

(65) Prior Publication Data

US 2010/0207017 A1 Aug. 19, 2010

(30) Foreign Application Priority Data

Feb. 16, 2009 (JP) ................................. 2009-033066

(51) Int. Cl.
*G01N 21/03* (2006.01)
*G01N 21/05* (2006.01)

(52) U.S. Cl.
USPC ....................................................... 250/492.1

(58) Field of Classification Search
USPC ........................................... 250/492.1, 492.3
See application file for complete search history.

(56) References Cited

U.S. PATENT DOCUMENTS

2007/0254386 A1* 11/2007 Asano ............................ 438/14
2011/0060552 A1* 3/2011 Ono ............................ 702/167

FOREIGN PATENT DOCUMENTS

JP 61-34936 2/1986
JP 5-47648 2/1993

OTHER PUBLICATIONS

Japanese Office Action issued Feb. 5, 2013, in Patent Application No. 2009-033066 (with English-language translation).

* cited by examiner

*Primary Examiner* — Casey Bryant
(74) *Attorney, Agent, or Firm* — Oblon, Spivak, McClelland, Maier & Neustadt, L.L.P.

(57) ABSTRACT

The height of selected points on the surface of a mask is measured, and if the number of measurement errors in this measurement is less than a predetermined value, an approximated curved surface for the mask surface is generated. The measurement data and height data obtained from the approximated curved surface are then compared, and if there is no point at which the difference between the measurement data and the data obtained from the approximated curved surface is greater than a predetermined threshold value, then it is determined that the reliability of the approximated curved surface is high and the height of the mask surface is corrected in accordance with this approximated curved surface.

3 Claims, 7 Drawing Sheets

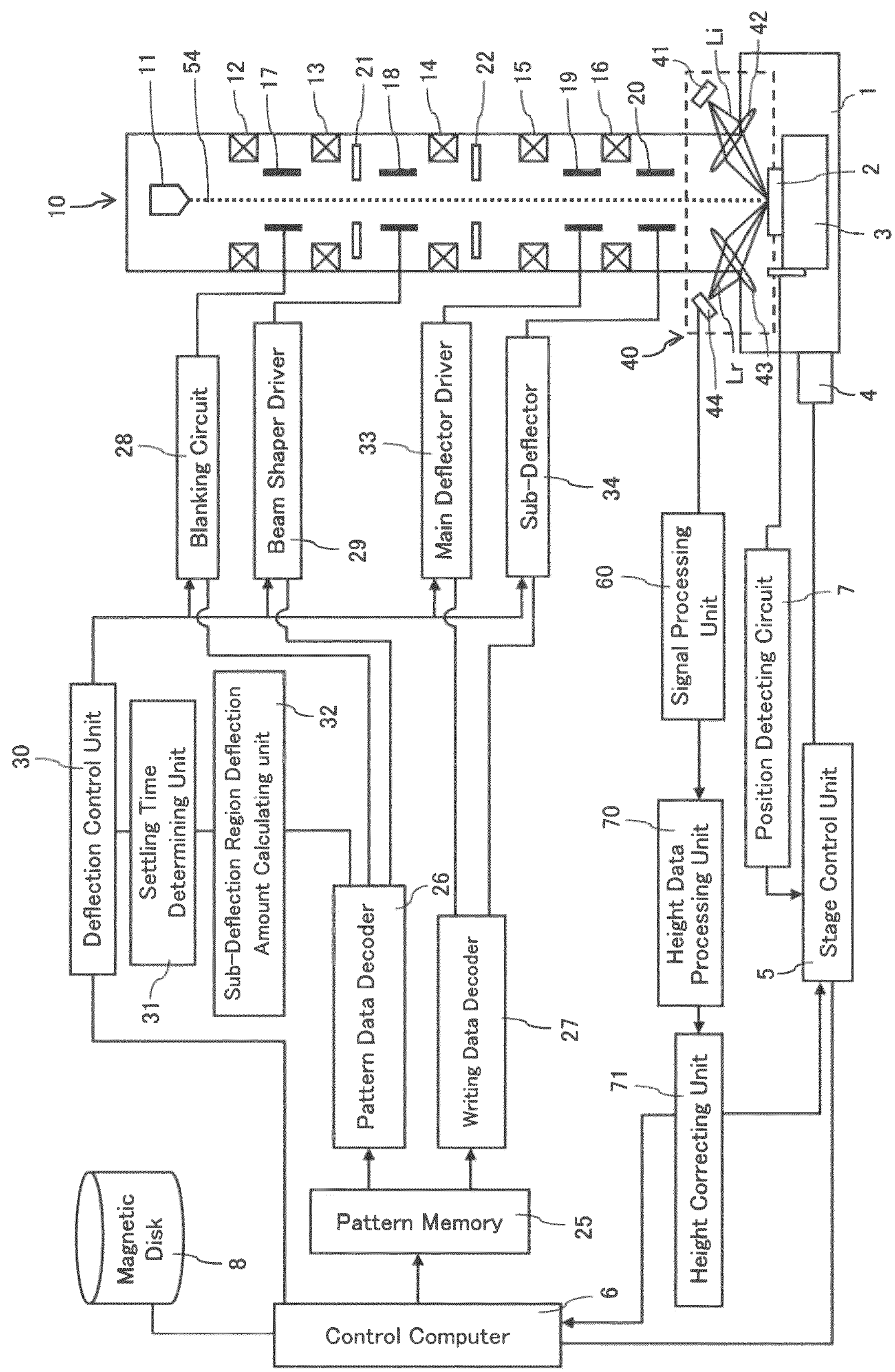
Fig.1
Magnetic Disk
Control Computer
Pattern Memory
Pattern Data Decoder
Writing Data Decoder
Deflection Control Unit
Settling Time Determining Unit
Sub-Deflection Region Deflection Amount Calculating unit
Blanking Circuit
Beam Shaper Driver
Main Deflector Driver
Sub-Deflector
Signal Processing Unit
Height Data Processing Unit
Height Correcting Unit
Position Detecting Circuit
Stage Control Unit
Li
Lr 40
44
photodetector
I/V converter amplifier
45
60
non-inverting amplifier
61
A/D converter unit
62
70
height data processing unit
Z1
height correcting
71
Z2
Z2
control computer
6
stage control unit
5

CHARGED PARTICLE BEAM WRITING METHOD AND CHARGED PARTICLE BEAM WRITING APPARATUS

BACKGROUND OF THE INVENTION

1. Field of the Invention

The present invention relates to a charged particle beam writing method and a charged particle beam writing apparatus.

2. Background Art

Electron beam writing apparatuses have been used to write a micropattern on a sample such as a mask substrate or a semiconductor wafer. When writing on a sample using such an apparatus, it is necessary to accurately measure the height of the surface of the sample before the write operation in order to avoid displacement of the electron beam from the target writing position, as well as to avoid defocus of the electron beam. Specifically, before the write operation, the height measuring unit in the electron beam writing apparatus emits light over the region to be irradiated, detects the reflected light, and thereby determines the height of the sample surface. The electron beam writing apparatus then adjusts, in accordance with the determined height, lenses for focusing the electron beam onto the sample surface, for example, thereby accurately focusing the beam onto the sample surface.

If the surface of the sample is perfectly flat, the desired pattern can be written thereon by measuring the height of any arbitrary point on the surface and directing and focusing the electron beam only at this height when writing anywhere on the surface. However, the surface of actual samples is not perfectly flat and is slightly deformed or warped. Therefore, if the electron beam is continuously focused only at a single height (which was determined at a selected point on the sample surface) when writing on the entire writing region on the sample surface, there will result displacement of the electron beam from desired writing positions as well as defocus of the electron beam.

To solve this problem, Japanese Laid-Open Patent Publication No. 61-34936 (1986) discloses a method of correcting displacement of the electron beam from desired writing positions and defocus of the electron beam due to deformation of the sample. According to this method, the height of several points on the sample surface is measured, and then a plurality of quadratic equations are formed using the measurement results. The coefficients of these quadratic equations are then determined by the least squares method. The resulting equation with the determined coefficients (a correction equation) is used to correct the focus of the electron beam and the deflection gain.

Thus, the method described in the above patent publication determines the height of every point on the sample surface by interpolation using height measurements of several points on the sample surface. In order for this interpolation to be effective, the measurement at these selected points must be accurate. It should be noted that a Z sensor is generally used for this measuring purpose. For example, an L-shaped moving mirror is mounted at one end of the XY stage on which the sample is placed, and a laser interferometer is disposed to face the mirror surface of the moving mirror. The laser interferometer is adapted to measure the XY coordinates of the XY stage and the angle of rotation of the XY stage in the X-Y plane by using the laser light reflected from the moving mirror. The measurement results are output to the control system which then outputs a control signal to the driving unit based on the measurement results to adjust the position of the XY stage in the X-Y plane. The control system also outputs a control signal to the Z sensor to measure the coordinate position of the sample in the Z-axis direction. It will be noted that the Z sensor is an optical position detector including a projector and a photodetector and uses an obliquely incident beam. The detection beam emitted downward at an angle from the projector impinges on the surface of the sample and is reflected upward at an angle to enter the photodetector. The parameters of this reflected beam incident on the photodetector are measured to detect the height of the sample surface.

It has been found, however, that the above measuring method is liable to measurement errors due to lack of intensity of the laser beam incident on the laser interferometer and due to poor coupling between the laser interferometer and the Z sensor. These measurement errors prevent the creation of a proper height distribution map based on the measurements by the Z sensor; that is, these errors may cause a distortion in the shape of the map or even prevent the preparation of any map.

The present invention has been made in view of the above problems. It is, therefore, an object of the present invention to provide a charged particle beam writing method and a charged particle beam writing apparatus capable of accurately focusing a charged particle beam onto the surface of a sample even when measurement errors occur by creating a map and performing the focusing operation in accordance with this map.

Other challenges and advantages of the present invention are apparent from the following description.

SUMMARY OF THE INVENTION

According to one aspect of the present invention, a charged particle beam writing apparatus comprises height measuring means for measuring the height of a surface of a sample placed on a stage, approximated curved surface generating means for generating an approximated curved surface for the surface from data obtained by the height measuring means, and height correcting means for correcting the height based on the approximated curved surface.

According to another aspect of the present invention, in a method of writing with a charged particle beam a predetermined pattern on a surface of a sample placed on a stage, the height of the surface of the sample is measured. The number of measurement errors in the measurement is determined. An approximated curved surface for the surface is generated when the number of measurement errors is less than a predetermined value. The reliability of the approximated curved surface is determined. If the reliability is determined to be high, then the height is corrected based on the approximated curved surface. If the reliability is determined to be low, then the number of measurement errors is incremented by the total number of points that are the cause of the low reliability of the approximated curved surface, and if the resulting number of measurement errors is less than the predetermined value, these steps are repeated.

BRIEF DESCRIPTION OF THE DRAWINGS

FIG. 1 is a schematic view showing the configuration of an electron beam writing apparatus according to an embodiment of the present invention.

DETAILED DESCRIPTION OF THE EMBODIMENTS

Figure 2:
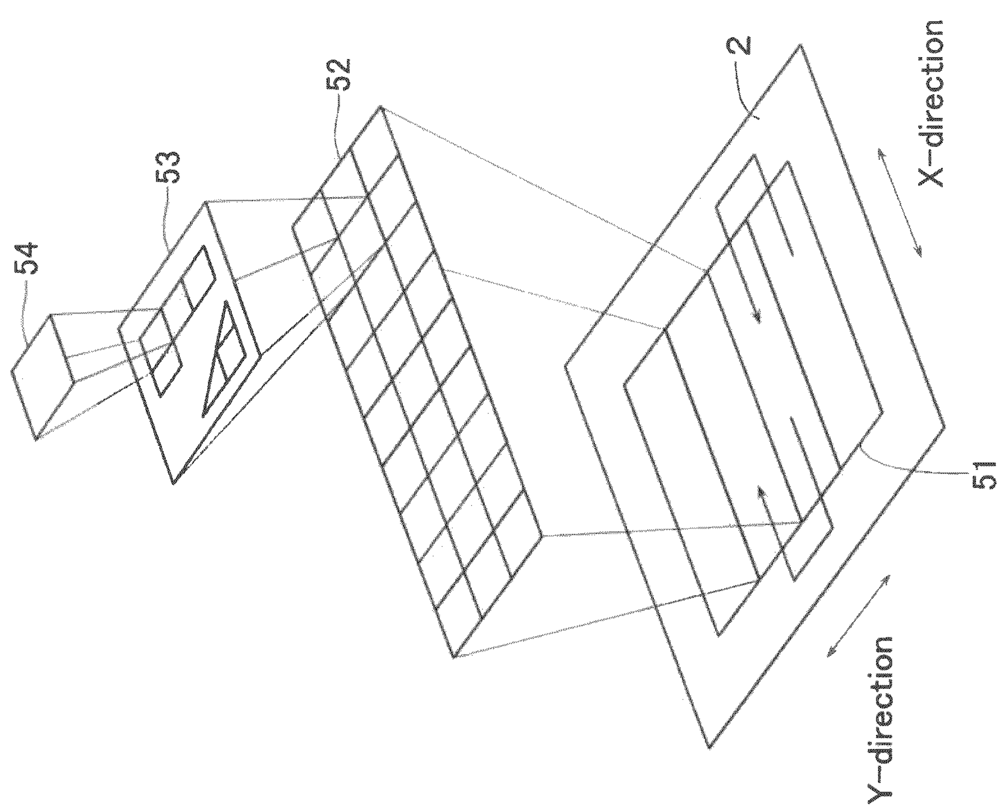
FIG. 2 is a schematic diagram illustrating an electron beam writing method.

FIG. 1 is a schematic view showing the configuration of an electron beam writing apparatus according to an embodiment of the present invention.

Referring to FIG. 1, in the electron beam writing apparatus, a writing chamber 1 houses a stage 3 on which a mask 2 (a sample) is mounted. A stage drive unit 4 causes the stage 3 to move in the X-direction (i.e., the lateral direction as viewed in FIG. 1) and the Y-direction (i.e., the direction perpendicular to the plane of the paper). The stage drive unit 4 is controlled by a control computer 6 through a stage control unit 5. It should be noted that the position of the stage 3 is measured by a position detecting circuit 7 using a laser interferometer, etc., and the measurement data is sent from the position detecting circuit 7 to the stage control unit 5.

An electron beam optical system 10 is disposed above the writing chamber 1. The electron beam optical system 10 includes an electron gun 11, various lenses 12, 13, 14, 15, and 16, a blanking deflector 17, a shaping deflector 18, a main deflector 19 and a sub-deflector 20 for beam scanning, and two beam shaping apertures 21 and 22.

FIG. 2 is a schematic diagram illustrating an electron beam writing method. As shown in this figure, a pattern 51 to be written on the mask 2 is divided into strip-shaped frame regions 52. The pattern is written on the mask 2 by an electron beam 54 on a frame region basis while the stage 3 is continuously moved in one direction (e.g., the X-direction). Each frame region 52 is divided into sub-deflection regions 53, and the pattern writing is performed only on a selected portion or portions of the sub-deflection regions 53 by the electron beam 54. It will be noted that the frame regions 52 are strip-shaped writing fields whose size is determined by the deflection width of the main deflector 19, and the sub-deflection regions 53 are unit writing fields whose size is determined by the deflection width of the sub-deflector 20.

The main deflector 19 moves the electron beam 54 to a target sub-deflection region 53, and the sub-deflector 20 scans the electron beam 54 over the sub-deflection region 53 for pattern writing. That is, the electron beam 54 is first moved to a predetermined sub-deflection region 53 by the main deflector 19 and then positioned at a target writing position in the sub-deflection region 53 by the sub-deflector 20. Further, the shape and size of the electron beam 54 are controlled by the shaping deflector 18 and the beam shaping apertures 21 and 22. Writing is then performed on the sub-deflection region 53 while the stage 3 is continuously moved in one direction. Upon completion of the writing on this sub-deflection region 53, the writing on the next sub-deflection region 53 is initiated. Further, upon completion of the writing on all the sub-deflection regions 53 in the current frame region 52, the stage 3 is moved one step in a direction perpendicular to the direction of the above continuous movement of the stage 3 (e.g., in the Y-direction) and then the next frame region 52 is subjected to a write operation. This procedure is repeated to write on one frame region 52 after another.

Referring to FIG. 1, a magnetic disk 8 (a storage medium) stores pattern writing data for the mask 2. The pattern writing data read from the magnetic disk 8 is temporarily stored in pattern memory 25 on a frame region basis. The pattern data for each frame region 52 stored in the pattern memory 25, that is, frame information which includes pattern writing position data, pattern shape data, etc. is sent to a pattern data decoder 26 and a writing data decoder 27 which serve as data analysis units.

The information from the patter data decoder 26 is sent to a blanking circuit 28 and a beam shaper driver 29. Specifically, the pattern data decoder 26 generates blanking data based on the above data and sends it to the blanking circuit 28. The pattern data decoder 26 also generates the desired beam size data and sends it the beam shaper driver 29. The beam shaper driver 29 then applies a predetermined deflection signal to the shaping deflector 18 in the electron beam optical system 10 to adjust the size of the electron beam 54.

Referring still to FIG. 1, a deflection control unit 30 is connected to a settling time determining unit 31 which is connected to a sub-deflection region deflection amount calculating unit 32. The sub-deflection region deflection amount calculating unit 32 is also connected to the pattern data decoder 26. Further, the deflection control unit 30 is also connected to the blanking circuit 28, the beam shaper driver 29, a main deflector driver 33, and a sub-deflector driver 34.

The output from the writing data decoder 27 is sent to the main deflector driver 33 and the sub-deflector driver 34. The main deflector driver 33 then applies a predetermined deflection signal to the main deflector 19 in the electron beam optical system 10 to deflect the electron beam 54 to a predetermined main deflection position. Further, the sub-deflector driver 34 applies a predetermined sub-deflection signal to the sub-deflector 20 to write on a sub-deflection region 53.

The writing control by the control computer 6 will now be described.

The control computer 6 reads pattern writing data for a mask stored in the magnetic disk 8 (a storage medium). The read pattern writing data is temporarily stored in the pattern memory 25 on a frame region basis.

The pattern writing data for each frame region 52 stored in the pattern memory 25, that is, frame information which includes pattern writing position data, pattern shape data, etc., is sent to the sub-deflection region deflection amount calculating unit 32, the blanking circuit 28, the beam shaper driver 29, the main deflector driver 33, and the sub-deflector driver 34 through the pattern data decoder 26 and the writing data decoder 27 which serve as data analysis units.

The pattern data decoder 26 produces blanking data based on the pattern writing data and sends it to the blanking circuit 28. The pattern data decoder 26 also produces the desired beam shape data based on the pattern writing data and sends it to the sub-deflection region deflection amount calculating unit 32 and the beam shaper driver 29.

The sub-deflection region deflection amount calculating unit 32 calculates the amount of electron beam deflection (or electron beam travel distance) for each shot in the sub-deflection regions 53 based on the beam shape data produced by the pattern data decoder 26. The resultant information is sent to the settling time determining unit 31, which determines a settling time corresponding to the distance of travel of the electron beam due to the sub-deflection.

The settling time determined by the setting time determining unit 31 is sent to the deflection control unit 30, and the deflection control unit 30 sends it to the blanking circuit 28, the beam shaper driver 29, the main deflector driver 33, or the sub-deflector driver 34, depending on the pattern writing timing.

The beam shaper driver 29 applies a predetermined deflection signal to the shaping deflector 18 in the electron beam optical system 10 to adjust the shape and size of the electron beam 54.

The writing data decoder 27 generates, based on the pattern writing data, data for positioning the electron beam in a sub-deflection region 53, and sends it to the main deflector driver 33. The main deflector driver 33 then applies a predetermined deflection signal to the main deflector 19 to deflect the electron beam 54 to a predetermined position in the sub-deflection region 53.

The writing data decoder 27 also generates, based on the pattern writing data, a control signal for the sub-deflector 20 to scan the beam. This control signal is sent to the sub-deflector driver 34 which then applies a predetermined sub-deflection signal to the sub-deflector 20. The sub-deflection region 53 is repeatedly irradiated with the electron beam 54 for pattern writing after the set settling time has elapsed.

A writing method using the electron beam writing apparatus will now be described.

First, the mask 2 is placed on the stage 3 in the writing chamber 1. Next, the position detecting circuit 7 detects the position of the stage 3, and in response to a signal from the control computer 6, the stage control unit 5 controls the stage drive unit 4 to move the stage 3 to position where writing is possible.

The electron gun 11 then emits the electron beam 54. The emitted electron beam 54 is focused by an illumination lens 12. The blanking deflector 17 operates so that the mask 2 is either radiated with the electron beam 54 or not irradiated with the electron beam 54.

The electron beam 54 directed to the first aperture 21 passes through the opening of the first aperture 21 and is deflected by the shaping deflector 18 controlled by the beam shaper driver 29. The electron beam 54 is then passed through the opening of the second aperture 22 so that the beam 54 assumes the desired shape and size. This beam shape corresponds to the smallest writing area on the mask 2 that can be independently irradiated with the electron beam 54.

After thus being shaped into the desired beam shape, the electron beam 54 is reduced in size by the reducing lens 15. The impinging position of the electron beam 54 on the mask 2 is adjusted by the main deflector 19 and the sub-deflector 20 controlled by the main deflector driver 33 and the sub-deflector driver 34, respectively. The main deflector 19 moves the electron beam 54 to a sub-deflection region 53 on the mask 2, and the sub-deflector 20 positions the electron beam 54 at a writing position in the sub-deflection region 53.

When writing on the mask 2 with the electron beam 54, the beam 54 is caused to scan the mask 2 while the stage 3 is moved in one direction. Specifically, a pattern is written in each sub-deflection region 53 while the stage 3 is moved in one direction. Upon completion of the writing on all the sub-deflection regions 53 in one frame region 52, the stage 3 is moved to a new frame region 52 and the above procedure is repeated to write on the new frame region 52.

After the completion of the writing on all frame regions 52 of the mask 2, the mask is replaced by a new mask and the above writing method is repeated.

Incidentally, when the mask 2 is supported on a plurality of support pins of the stage 3, the mask is bowed or warped under its own weight. Further, when the bottom surface of the mask 2 is held on the stage 3, the height of the top surface of the mask 2 is affected by the inherent thickness of the mask 2 and the parallelism between the top and bottom surfaces of the mask 2. Thus, the actual height of the top surface of the mask 2 varies depending in combination on the surface features, thickness, and warpage of the mask 2 and the parallelism between its top and bottom surfaces. This variation may cause displacement of the electron beam 54 from desired writing positions and defocus of the electron beam 54, preventing formation of the desired pattern on the mask 2. To overcome this problem, it is necessary to accurately measure the height of the surface of the mask 2.

The height of the surface of the mask 2 placed on the stage 3 is measured by a height measuring unit 40 serving as height measuring means. The height measuring unit 40 is also referred to as "Z sensor," and includes: a light source 41; a projector lens 42 for focusing light Li emitted from the light source 41 onto the mask 2; a photodetector lens 43 for receiving and focusing the light Lr reflected from the mask 2; and a photodetector 44 for receiving the light Lr focused by the photodetector lens 43 and detecting the position of the light. The photodetector 44 may be a position sensitive detector (PSD).

When the photodetector 44 detects the position of the light, this positional information is sent through a signal processing unit 60 to a height data processing unit 70 which then generates height data. More specifically, the height data processing unit 70 receives the output signal from the photodetector 44 and converts this signal into height data for the surface of the mask 2, where this height data corresponds to the position of the light detected by the photodetector 44.

Figure 3:
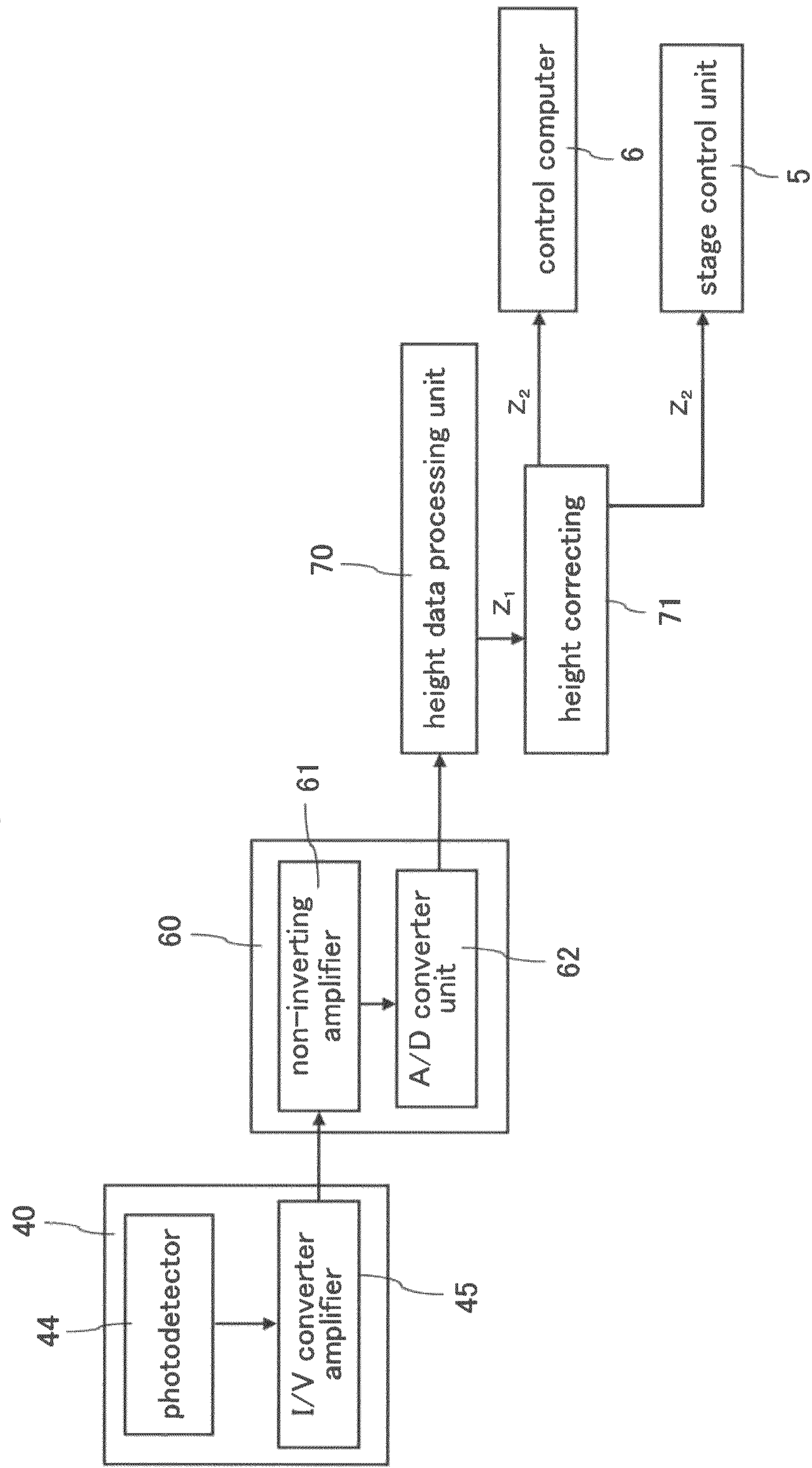
FIG. 3 is a diagram illustrating a height measuring method of the embodiment.

In the height measuring unit 40, the photodetector 44 outputs two signals (or current values) $I_1$ and $I_2$, as shown in FIG. 3. These current signals (or current values) $I_1$ and $I_2$ are converted by an I/V converter amplifier 45 to voltage signals (or voltage values) $V_1$ and $V_2$ which are then input to the signal processing unit 60. In the signal processing unit 60, the signals $V_1$ and $V_2$ are amplified to appropriate voltage levels by a non-inverting amplifier 61 and then converted into digital data by an A/D converter unit 62. The digital data is then sent to the height data processing unit 70.

Figure 4:
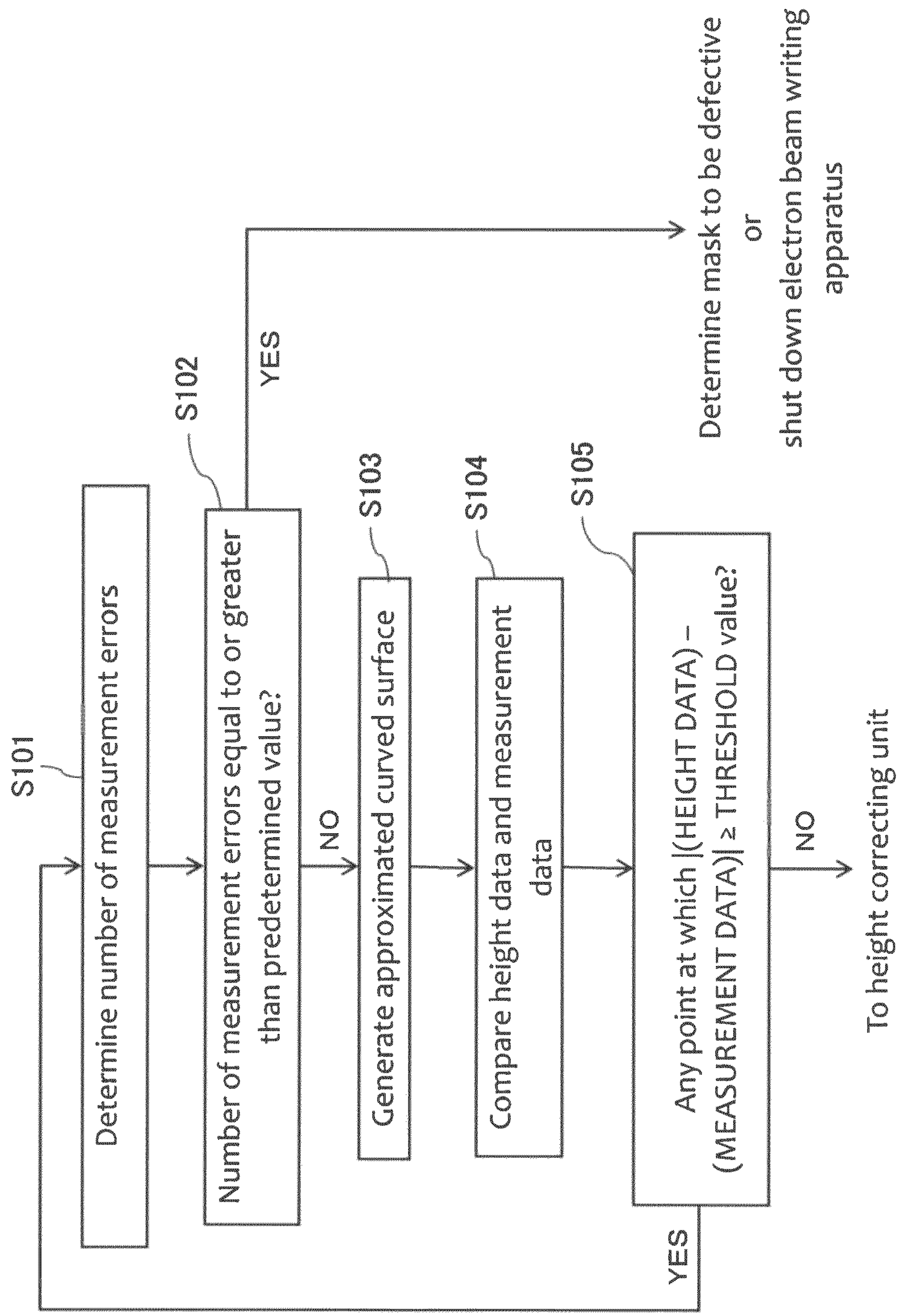
FIG. 4 is a flowchart showing a processing method performed by a height data processing unit.

FIG. 4 is a flowchart showing the data processing method performed by the height data processing unit 70. Further, FIG. 5 is a plan view of the mask 2 placed on the stage 3 in the writing chamber 1 shown in FIG. 1, illustrating a height distribution map making method.

Figure 5:
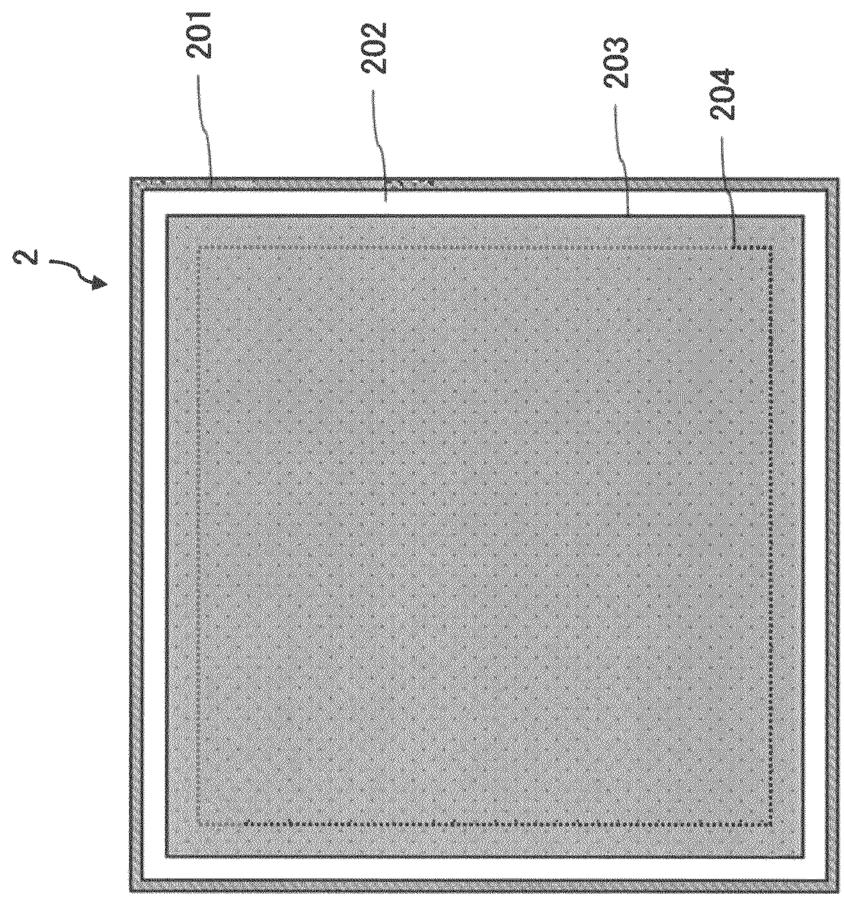
FIG. 5 is a plan view of the mask illustrating a height distribution map making method.

Referring to FIG. 5, the surface of the mask 2 is coated with a resist (not shown). In this case, since the resist film thickness tends not to be uniform on the peripheral portion of the mask 2, writing is not performed on the peripheral area, which is herein referred to as the "write prohibited region 201." On the other hand, writing is performed on the area inside the write prohibited region 201, and this area is herein referred to as the "write permitted region 202." However, since the writing accuracy decreases as the peripheral portion of the mask 2 is approached, a writing accuracy guaranteed region on which a predetermined writing accuracy is guaranteed lies farther inside the write prohibited region 201. (In FIG. 5, this region is denoted by reference numeral 203.)

Conventional methods are disadvantageous in that measurement errors tend to occur on the peripheral portion of the mask 2. To address this problem, the present embodiment defines a height measurement region 204 inside the writing accuracy guaranteed region 203, and the height measuring unit 40 only measures the height of the surface of the mask 2 over this region. For example, the height measurement region 204 may be defined as follows. Grid lines are drawn on the writing accuracy guaranteed region 203, and a height measurement is performed at each intersection point n times. The height measurement region 204 may be defined as an area which includes at least a predetermined number of intersection points at which a measurement error did not occur in at least n' number of measurement operations, where 'n>n'.

It is found that the portions of the mask surface on which measurement errors tend to occur differ with the type of resist used. Therefore, if the resist is of such a type that height measurement errors are not particularly likely to occur on the peripheral portion of the mask 2, that is, if height measurement errors are equally likely to occur over the entire surface of the mask 2, then the region whose height is to be measured by the height measuring unit 40 may be defined to coincide with the writing accuracy guaranteed region 203.

The measurement data is sent from the height measuring unit 40 to the height data processing unit 70 through the signal processing unit 60, as shown in FIG. 3. The height data processing unit 70 then determines the number of measurement errors at step S101, as shown in FIG. 4.

If it is determined at step S102 that the number of measurement errors is less than a predetermined value, then an approximated curved surface for the surface of the mask 2 is generated from the measurement data at step S103. For example, grid lines may be drawn on the height measurement region 204 in the X-axis direction and Y-axis direction, and a height measurement may be performed at each intersection point. Then if the number of measurement errors at the same X coordinate or Y coordinate is less than 3, an approximated curved surface may be generated from the measurement data.

The approximated curved surface generated at step S103 allows one to obtain, by interpolation using measurement data, height data at measurement points on the height measurement region 204 of FIG. 5 at which a measurement error has occurred or no measurement has been made.

One method of interpolation is to assume the surface of the mask 2 to be a differentiable curved surface and use a cubic spline interpolation technique, which allows for generation of a smooth approximated curve from discrete points. Spline interpolation will now be described. According to elementary dynamics, the spline curve between two adjacent points is a cubic polynomial. That is, a spline function $S_i(x)$ may be expressed by:

$$S_i(x)=a_ix^3+b_ix^2+c_ix+d_i\ (i=1, 2, \ldots N-1) \tag{1}$$

Further, a spline curve between $x_i$ and $x_{i+1}$ can be determined by calculating the coefficients $a_i$, $b_i$, $c_i$, and $d_i$ from given values of x and y. Thus, a smooth spline curve connecting two points can be obtained by determining these coefficients $a_i$, $b_i$, $c_i$, and $d_i$. This means that two-dimensional application of spline interpolation may be used to determine a spline curved surface passing through four measurement points.

For example, if z denotes a measured height of a point (x, y) on the surface of the mask 2, the surface feature is represented by the coefficients $a_0$ to $a_{14}$ of the following function. Therefore, this equation may be used to perform interpolation processing on each point (x, y) to obtain height data over the entire surface of the mask 2, thus determining an approximated curved surface of the mask 2.

$$z = a_0 + a_1x + a_2y + a_3x^2 + a_4xy + a_5y^2 + a_6x^3 + a_7x^2y + a_8xy^2 + a_9y^3 + a_{10}x^4 + a_{11}x^3y + a_{12}x^2y^2 + a_{13}xy^3 + a_{14}y^4$$

It will be noted that in order to increase the processing speed, the interpolation processing may use a lower order spline interpolation function such as quadratic spline interpolation or linear spline interpolation, or alternatively, the interpolation processing may use Lagrange approximation or the least squares method.

At step S103, height data of regions of the mask 2 outside the height measurement region 204 is also obtained by interpolation using the measurement data. These regions outside the height measurement region 204 may include not only the writing accuracy guaranteed region 203 shown in FIG. 5, but also the write permitted region 202 and the write prohibited region 201. In this way it is possible to make a height distribution map of the entire surface of the mask 2, regardless of occurrence of measurement errors. Further according to the present embodiment, height data of an outside region of the mask 2 may be obtained by interpolation.

Figure 6A:
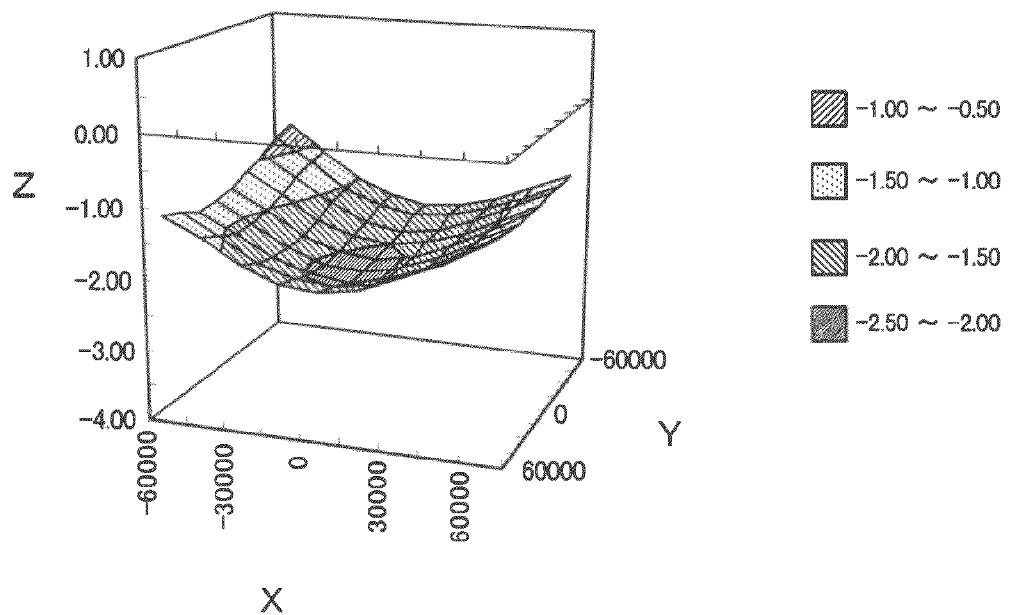
FIG. 6A shows an exemplary approximated curved surface for the surface feature of the height measurement region.
Figure 6B:
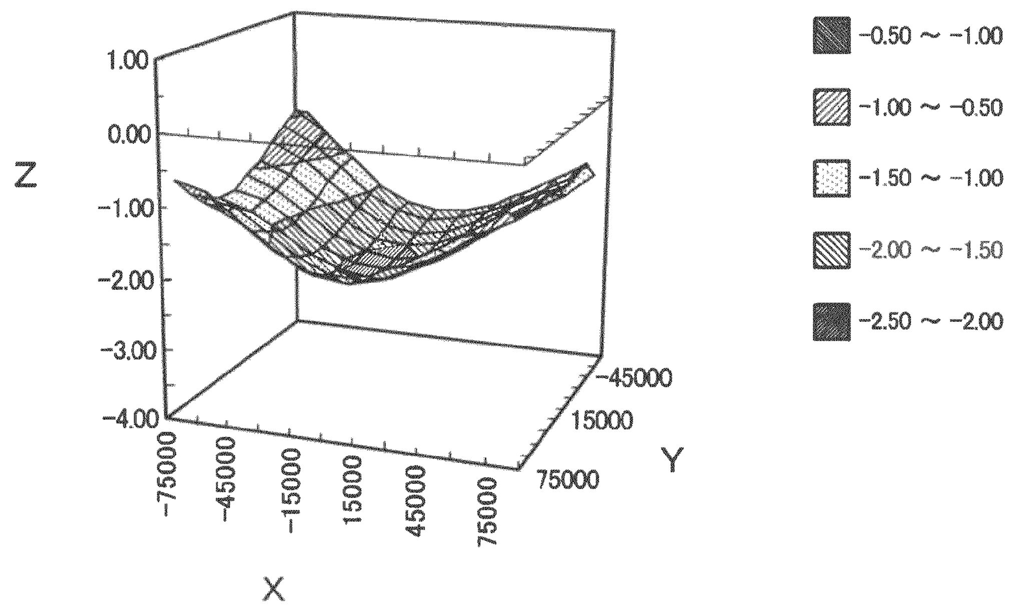
FIG. 6B shows an exemplary approximated curved surface for the entire surface of the mask, where this approximated curved surface was obtained by interpolation of the data of the approximated curved surface shown in FIG. 6A.
Figure 6C:
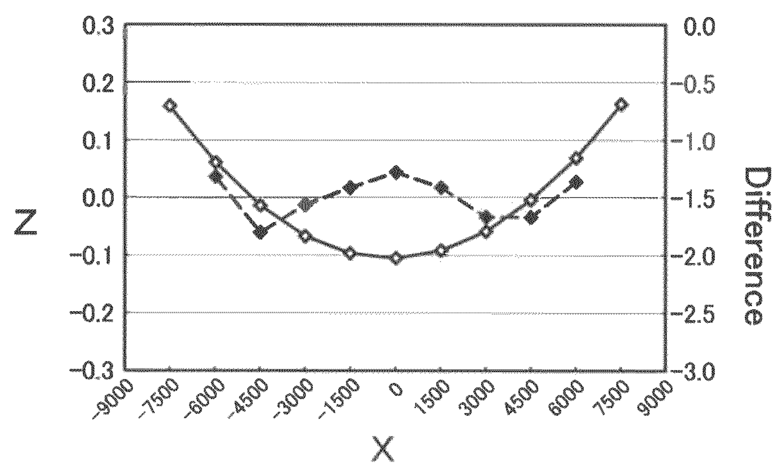
FIG. 6C is a diagram comparing height data of a surface obtained from an approximated curved surface with height measurement data of the surface.

FIG. 6A shows an exemplary approximated curved surface for the surface feature of the height measurement region 204. FIG. 6B shows an exemplary approximated curved surface for the entire surface of the mask 2, where this approximated curved surface was obtained by interpolation of the data of the approximated curved surface shown in FIG. 6A. Further, FIG. 6C is a diagram comparing height data of a surface obtained from an approximated curved surface with height measurement data of the surface. Specifically, in FIG. 6C, the solid line represents height data obtained from the approximated curved surface shown in FIG. 6B. Further, the broken line represents the difference between the actual height measurement data and the height data represented by the solid line.

If the difference between the height data obtained from the approximated curved surface and the actual height measurement data is within a predetermined range, it can be determined that height data of the surface of the mask 2 can be produced from the data of the approximated curved surface. If the above difference is not within the predetermined range, on the other hand, a problem may arise with the use of the data of the approximated curved surface. Therefore, steps S104 and S105 determine the reliability, or accuracy, of the approximated curved surface.

In order to determine the reliability of the approximated curved surface, step S104 compares the height data at each two adjacent points on the approximated curved surface, and step S105 determines whether the difference between the height data at any two adjacent points is greater than a predetermined threshold value. Alternatively, step S104 may compare the height measurement data and the height data obtained from the approximated curved surface, and step S105 may determine whether the absolute value of the difference between the height measurement data and the height data at any point is greater than a predetermined threshold value. Or step S105 may determine whether both data difference conditions are satisfied in order to determine the reliability of the approximated curved surface.

If it is determined at step S105 that there are no points that satisfy the above data difference conditions, then it is determined that the reliability of the approximated curved surface is high and hence height data of the surface of the mask can be obtained from the data of the approximated curved surface. Therefore, height data $Z_1$ of the surface of the mask 2 is subsequently obtained using the approximated curved surface obtained at step S103. It should be noted that height data of the mask surface is obtained from the approximated curved surface at predetermined time intervals (e.g., 20 msec or less), and these data is time averaged by averaging processing to produce the height data $Z_1$. In this averaging processing, the maximum and minimum values in the sampled data are removed before the data is averaged.

Subsequently, a height correcting unit 71 serving as height correcting means performs linearity correction processing on the height data $Z_1$ after performing averaging processing such as described above. This linearity correction processing corrects the linearity of the data with respect to the height of the sample surface. Specifically, the height correcting unit 71 performs polynomial approximation computation using specific correction coefficients that allow the unit 71 to produce data accurately representing variation in the height of the sample surface by using the normalized data obtained by the photodetector 44 and multiplying it with a particular resolution (um/bit). These correction coefficients for the polynomial approximation computation are calculated by mounting a prototype (or sample 2) serving as a height reference and determining specific polynomial approximation coefficients representing its height dimension by a least squares fit of measured height data of the prototype. It should be noted that this prototype is a sample having a plurality of steps whose dimensions have been accurately measured. Although in this way the desired height data is obtained, the height of the surface of the mask 2 must be specified relative to the height reference surface of the electron beam writing apparatus. Therefore, the height data of the height reference surface is subtracted from the obtained height data of the surface of the mask 2 to produce the relative height data $Z_2$ of the surface of the mask 2.

The height data $Z_2$ thus obtained by the height correcting unit 71 is sent to the stage control unit 5. The stage control unit 5 then controls the stage drive unit 4 to adjust the position of the stage 3. In this way the height of the surface of the mask 2 is adjusted before writing with the electron beam. After the completion of this adjustment, the electron beam optical system 10 is adjusted based on the height data $Z_2$. For example, after the height data $Z_2$ is sent from the height correcting unit 71 to the deflection control unit 30 through the control computer 6, the main deflector driver 33 applies a predetermined deflection signal to the main deflector 19 to adjust the main deflector 19. In this way, the main deflector 19, which has been already optimally adjusted with respect to the height reference surface, can be adjusted in accordance with the height data $Z_2$, enabling writing on the desired location on the sample. It should be noted that suitable components which can be adjusted in accordance with the height data $Z_2$ include, in addition to the main deflector 19, the electrostatic lens 16 and the sub-deflector 20. Adjusting these components in accordance with the height data $Z_2$ can result in the same effect as described above.

On the other hand, if it is determined at step S105 that there are one or more points that satisfy the above data difference conditions, then the reliability of the approximated curved surface is determined to be low. Therefore, subsequently, the number of measurement errors determined at step S101 is incremented by the total number of these points (satisfying the above data difference conditions) which are the cause of the low reliability of the approximated curved surface, and the processing returns to step S101. Then, if it is determined at step S102 that the resulting number of measurement errors is equal to or greater than the predetermined value, the mask is determined to be defective and is not subjected to any write operation, or the height measuring unit 40 shown in FIG. 1 is determined to be malfunctioning and the electron beam writing apparatus is shutdown. In the latter case, the height measuring unit 40 is subsequently restored or repaired by adjusting or replacing various parts, and steps S101 to S105 are repeated.

On the other hand, if it is determined at step S102 that the number of measurement errors is less than the predetermined value, an approximated curved surface for the surface of the mask 2 is generated, by interpolation, from data D which is the measurement data used at step S102 in the previous iteration exclusive of the data at the points that are determined at step S105 in the previous iteration to be the cause of the low reliability of the previous approximated curved surface. The processing then proceeds to step S104 and then to step S105, as described above. It should be noted that interpolation using the data D is used to obtain height data at the points that are determined at step S105 in the previous iteration to be the cause of the low reliability of the previous approximated curved surface, as well as height data at the points at which a measurement error has occurred or no measurement has been made.

According to the present embodiment, an approximated curved surface of a mask is generated from measurement data of the height of selected points on the surface of the mask, and height data at points on the surface of the mask at which a measurement error has occurred or no measurement has been made is obtained by interpolation using this approximated curved surface. In this way it is possible to make a height distribution map of the surface of the mask, regardless of occurrence of measurement errors. Writing can be then performed on the desired location on the mask by an electron beam positioned in accordance with height values obtained from this height distribution map of the surface of the mask. Further, whether the number of height measurement errors is large is determined before the write operation, avoiding writing on the mask before accurately measuring the height of the mask. This prevents wasting of the writing time and wasting of substrates on which writing is performed.

It will be understood that the present invention is not limited to the embodiment described above, since various alterations may be made thereto without departing from the spirit and scope of the invention.

For example, in the embodiment described above, the height measuring unit 40 measures the height of selected points on the surface of the mask 2 placed on the stage 3 and outputs a signal indicative of the measurement results to the height data processing unit 70 which then converts the output signal to height data for the surface of the mask 2. More specifically, if it is determined that the number of errors in the measurement by the height measuring unit 40 is less than a predetermined value, then an approximated curved surface for the surface of the mask 2 is generated from the measurement data, and height data $Z_1$ of the surface of the mask 2 is obtained from this approximated curved surface. Subsequently, the height correcting unit 71 performs linearity correction processing on the height data $Z_1$ after performing averaging processing on the data, and generates height data $Z_2$ of the surface of the mask 2.

However, in other embodiments of the present invention, the data from the height measuring unit may be input to the height correcting unit which may then perform averaging processing and linearity correction processing on the data as described above. The height data processing unit may then generate an approximated curved surface for the surface of the mask. That is, the order of processing by the height data processing unit and the height correcting unit may be reversed from that of the above embodiment.

In this way a height distribution map of the surface of a mask can also be generated from measurement data of the height of selected points on the surface, regardless of occurrence of measurement errors. Writing can be then performed on the desired location on the mask by an electron beam positioned in accordance with height values obtained from this height distribution map of the surface of the mask. Further, whether the number of height measurement errors is large is determined before the write operation, avoiding writing on the mask before accurately determining the height of the mask. This prevents wasting of the writing time and wasting of substrates on which writing is performed.

Further, although the present embodiment uses an electron beam, it is to be understood that the present invention is not limited to electron beams, but may be applied to other charged particle beams such as ion beams.

The features and advantages of the present invention may be summarized as follows.

According to the first aspect of the present invention, a charged particle beam can be accurately focused onto the surface of a sample even when measurement errors occur by creating a map and performing the focusing operation in accordance with this map.

The second aspect of the present invention provides a charged particle beam apparatus capable of accurately focusing a charged particle beam onto the surface of a sample even when measurement errors occur by creating a map and performing the focusing operation in accordance with this map.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-033066, filed on Feb. 16, 2009 including specification, claims, drawings and summary, on which the Convention priority of the present application is based, are incorporated herein by reference in its entirety.

What is claimed is:

1. A charged particle beam writing apparatus comprising:

a height measuring unit configured to measure the height of a surface of a sample placed on a stage and to produce corresponding measured height data;

a height data processing unit configured to generate an approximated curved surface for said surface from said measured height data obtained by said height measuring unit, to determine measurement errors based on differences between the approximated curved surface and the measured height data, and to determine that the generated approximated curved surface is reliable when a number of the measurement errors is less than a predetermined amount, and to obtain approximated height data from data of the approximated curved surface when the reliability is determined to be sufficiently high; and a height correcting unit configured to correct said height based on the approximated height data obtained from data of the approximated curved surface.

2. The charged particle beam writing apparatus according to claim 1, wherein:

said height measuring unit measures the height of a surface of a predetermined region of said sample, said predetermined region not including a write prohibited region of said sample; and said height data processing unit interpolates said data obtained by said height measuring unit to generate the approximated curved surface of said predetermined region and another region.

3. The charged particle beam writing apparatus according to claim 1, wherein said height measuring unit includes:

a light source; a projected lens for focusing light emitted from said light source onto said sample;

a photodetector lens for receiving and focusing the light reflected from said sample; and a photodetector for receiving said light focused by said photodetector lens and detecting the position of said light.

* * * * *